United States Patent
Zhuang et al.

(10) Patent No.: US 10,014,268 B2
(45) Date of Patent: Jul. 3, 2018

(54) SEMICONDUCTOR CHIP, SEMICONDUCTOR DEVICE AND MANUFACTURING PROCESS FOR MANUFACTURING THE SAME

(71) Applicant: Advanced Semiconductor Engineering, Inc., Kaohsiung (TW)

(72) Inventors: Chun-Jun Zhuang, Kaohsiung (TW); Hung-Chun Kuo, Kaohsiung (TW); Chun-Chin Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/057,673

(22) Filed: Mar. 1, 2016

(65) Prior Publication Data
US 2017/0256508 A1    Sep. 7, 2017

(51) Int. Cl.
*H01L 23/00* (2006.01)

(52) U.S. Cl.
CPC .............. *H01L 24/06* (2013.01); *H01L 24/03* (2013.01); *H01L 24/14* (2013.01); *H01L 2224/02375* (2013.01); *H01L 2224/02381* (2013.01); *H01L 2224/03472* (2013.01); *H01L 2224/06051* (2013.01); *H01L 2224/06152* (2013.01); *H01L 2224/14051* (2013.01)

(58) Field of Classification Search
CPC ......... H01L 24/06; H01L 24/14; H01L 24/03; H01L 2224/06051; H01L 2224/03472; H01L 2224/02375; H01L 2224/02381; H01L 2224/14051; H01L 2224/06152; H01L 2224/1403; H01L 2224/0603
See application file for complete search history.

(56) References Cited

U.S. PATENT DOCUMENTS

| 8,487,438 | B2 | 7/2013 | Lin et al. | |
|---|---|---|---|---|
| 2005/0136636 | A1* | 6/2005 | Shim | H01L 21/2885 438/597 |
| 2008/0157336 | A1* | 7/2008 | Yang | H01L 21/6835 257/690 |
| 2009/0001607 | A1* | 1/2009 | Schnitt | H01L 23/60 257/779 |
| 2011/0278736 | A1* | 11/2011 | Lin | H01L 25/50 257/774 |
| 2016/0027754 | A1* | 1/2016 | Katagiri | H01L 24/02 257/737 |
| 2016/0079205 | A1* | 3/2016 | Lin | H01L 21/4853 257/737 |
| 2017/0084559 | A1* | 3/2017 | Park | H01L 23/50 |

* cited by examiner

*Primary Examiner* — Steven Loke
*Assistant Examiner* — Juanita Rhodes
(74) *Attorney, Agent, or Firm* — Foley & Lardner LLP; Cliff Z. Liu

(57) ABSTRACT

A semiconductor device includes a substrate main body, a plurality of first bump pads, and redistribution layer (RDL). The first bump pads are disposed adjacent to a surface of the substrate main body, each of the first bump pads has a first profile from a top view, the first profile has a first width along a first direction and a second width along a second direction perpendicular to the first direction, and the first width of the first profile is greater than the second width of the first profile. The RDL is disposed adjacent to the surface of the substrate main body, and the RDL includes a first portion disposed between two first bump pads.

18 Claims, 10 Drawing Sheets

SEMICONDUCTOR CHIP, SEMICONDUCTOR DEVICE AND MANUFACTURING PROCESS FOR MANUFACTURING THE SAME

BACKGROUND

1. Field of the Disclosure

The present disclosure relates to a semiconductor chip, a semiconductor device and a manufacturing process for manufacturing the same, and more particularly to a semiconductor chip and a semiconductor device capable of routing a redistribution layer (RDL) under the semiconductor chip and a method for manufacturing the same.

2. Description of the Related Art

A conventional semiconductor package may include a substrate and a semiconductor chip disposed on the substrate. The substrate may include a RDL and bump pads. The semiconductor chip may include pillars bonded to the bump pads in a chip bonding area of the substrate. The RDL may need to bypass or be routed away from the chip bonding area, to avoid short circuits between the RDL and bump pads in the chip bonding area. However, such configuration may lead to increased path length and increased impedance in the RDL, and thus adversely affecting the performance of the circuitry within the semiconductor package.

SUMMARY

In an aspect, a semiconductor chip includes a chip main body, at least one first pillar and at least one second pillar. The first pillar is disposed adjacent to a surface of the chip main body. The first pillar has a first profile from a bottom view, the first profile has a first width along a first direction and a second width along a second direction perpendicular to the first direction, and the first width of the first profile is greater than the second width of the first profile. The second pillar is disposed adjacent to the surface of the chip main body, the second pillar has a second profile from a bottom view, and a shape of the first profile is different from a shape of the second profile.

In an aspect, a semiconductor device includes a substrate main body, a plurality of first bump pads, and an RDL. The first bump pads are disposed adjacent to a surface of the substrate main body, each of the first bump pads has a first profile from a top view, the first profile has a first width along a first direction and a second width along a second direction perpendicular to the first direction, and the first width of the first profile is greater than the second width of the first profile. The RDL is disposed adjacent to the surface of the substrate main body, and the RDL includes a first portion disposed between two first bump pads.

In an aspect, a semiconductor device includes a substrate main body, a chip bonding area on the substrate main body, and an RDL. The RDL is disposed adjacent to a surface of the substrate main body. The RDL includes a first portion disposed within the chip bonding area and a second portion disposed outside the chip bonding area. A width of the first portion is less than a width of the second portion.

In an aspect, a manufacturing process includes (a) providing a substrate main body, the main body including pads adjacent to a surface thereof; (b) forming a photoresist layer adjacent to the surface of the substrate main body and covering the pads; (c) forming first openings and second openings in the photoresist layer to expose the pads, where a shape of the second openings is different from a shape of the first openings, and a cross-sectional area of each of the second openings is substantially equal to a cross-sectional area of each of the first openings; (d) filling the first openings and the second openings concurrently with a metal; and (e) removing the photoresist layer.

DETAILED DESCRIPTION

The present disclosure provides an improved semiconductor package structure allowing for reduced circuit path length in an RDL.

Pillars of a semiconductor chip may be bonded to bump pads in a chip bonding area of a substrate, and a size and a position of each bump pad in a chip bonding area may correspond to a size and a position of a corresponding pillar. A pitch between adjacent pillars may be small, and, correspondingly, a pitch between adjacent bump pads in the chip bonding area may also be small. Therefore, a gap between two adjacent bump pads in the chip bonding area may be small. If a portion of the RDL passes through the gap, there is a risk of short circuit due to the RDL contacting one or both of the bump pads. To address such concerns, the RDL may be designed to bypass or to be routed away from the bump pads in the chip bonding area. However, such bypass or routing away may significantly increase a path length (and an impedance) of a circuit path in the RDL. Consequently, such bypassed away or routed away design may adversely affect a performance of circuitry within a semiconductor package.

To address the above concerns, an improved structure is formed that provides shorter path length (and lower impedance) of circuit paths in the RDL, through improved pillar structure and bump pad structure. The techniques described may be helpful to yield circuitry with improved performance. The improved pillar structure provides for a wider gap between adjacent pillars, and the improved bump pad structure provides for a wider gap between adjacent bump pads, so that a portion of the RDL can pass through the gap space between the two adjacent bump pads directly rather than being bypassed away or routed away. The risk of a short circuit is low because the portion of the RDL will not readily contact one or both of the two bump pads.

Figure 1:
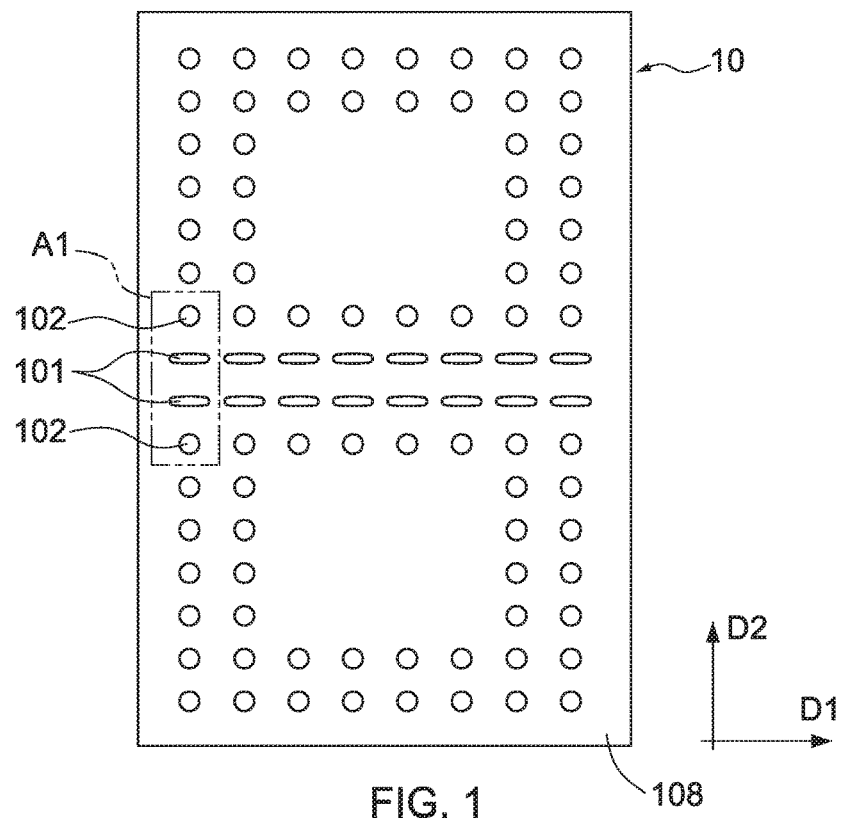
FIG. 1 illustrates a bottom view of a semiconductor chip according to an embodiment of the present disclosure.

FIG. 1 illustrates a bottom view of a semiconductor chip 10 according to an embodiment of the present disclosure. The semiconductor chip 10 includes first pillars 101 and second pillars 102 for electrical connections. The first pillar 101 has a first profile from the bottom view, and the second pillar 102 has a second profile from the bottom view, and a shape of the first profile is different from a shape of the second profile. In one or more embodiments, a shape of the first profile of the first pillar 101 is substantially elliptical, and a shape of the second profile of the second pillar 102 is substantially circular.

The first pillars 101 are arranged along a first direction D1. The first pillars 101 are arranged in an array, and the second pillars 102 are arranged such that there is an array of the second pillars 102, with a subarray of the second pillars 102 on each of two sides of the array of the first pillars 101. In the embodiment of FIG. 1, there are two rows in the array of the first pillars 101, and each array of the second pillars 102 is arranged in a ring-link structure. It is noted that a gap space between the two rows of first pillars 101 corresponds to a portion of an RDL of a substrate.

A passivation layer 108 exposes the first pillars 101 and the second pillars 102 from the bottom view illustrated in FIG. 1.

Figure 2:
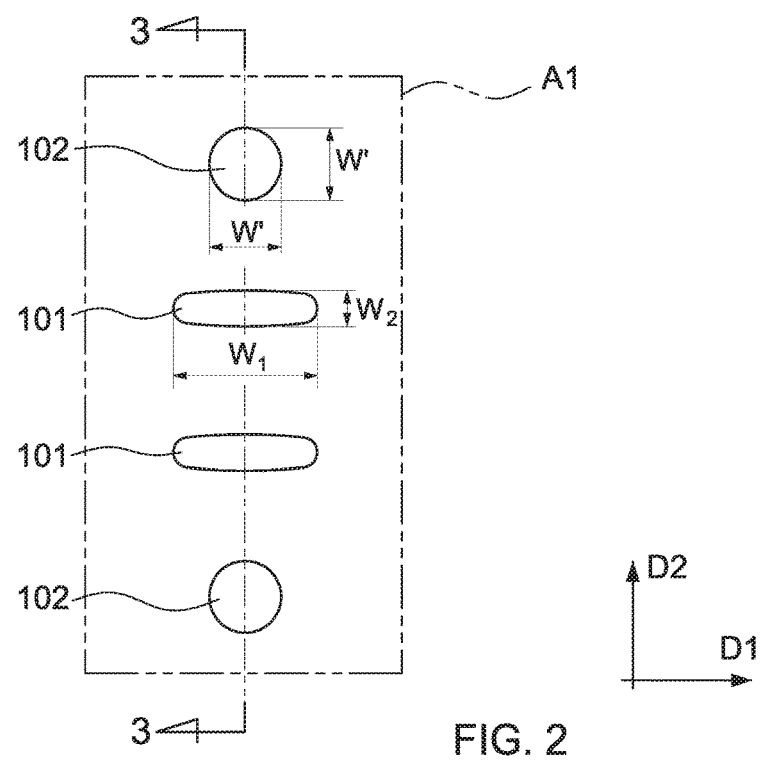
FIG. 2 illustrates an enlarged view of a region A1 shown in FIG. 1 according to an embodiment of the present disclosure.

FIG. 2 illustrates an enlarged view of a region A1 of the semiconductor chip 10 shown in FIG. 1 according to an embodiment of the present disclosure. The first profile of the first pillar 101 has a first width $W_1$ along the first direction D1 and a second width $W_2$ along a second direction D2 perpendicular to the first direction D1. The first width $W_1$ of the first profile of the first pillar 101 is greater than the second width $W_2$ of the first profile of the first pillar 101. In one or more embodiments, the first width $W_1$ of the first profile of the first pillar 101 is at least about 2 times greater, at least about 3 times greater, or about four to about nine times greater than the second width $W_2$ of the first profile of the first pillar 101. In other words, $(W_1)>(n)(W_2)$, where, in some embodiments, $4 \leq n \leq 9$. In the embodiment illustrated in FIG. 2, the shape of the second profile of the second pillar 102 is approximately circular and has a diameter W'. In other words, the second profile of the second pillar 102 has a diameter W' along the first direction D1 and along the second direction D2. More generally, the second profile has a first width along the first direction D1 and a second width along the second direction D2 perpendicular to the first direction, and the first width of the second profile is substantially equal to the second width of the second profile. In the embodiment shown in FIG. 2, the first width $W_1$ of the first profile of the first pillar 101 is about two times the diameter W' of the second pillar 102, and the second width $W_2$ of the first profile of the first pillar 101 is about half of the diameter W' of the second pillar 102. Thus, in this embodiment, the first width $W_1$ of the first profile of the first pillar 101 is approximately four times the second width $W_2$ of the first profile of the first pillar 101. In some embodiments, an area of the first profile of the first pillar 101 is substantially equal to an area of the second profile of the second pillar 102.

Referring back to FIG. 1, it is noted that a pitch between adjacent first pillars 101 may be similar to, or may be different from, a pitch between adjacent second pillars 102. It is further noted that a pitch between a first pillar 101 and an adjacent second pillar 102 may be similar to, or may be different from, the pitch between adjacent first pillars 101 or the pitch between adjacent second pillars 102.

Figure 3:
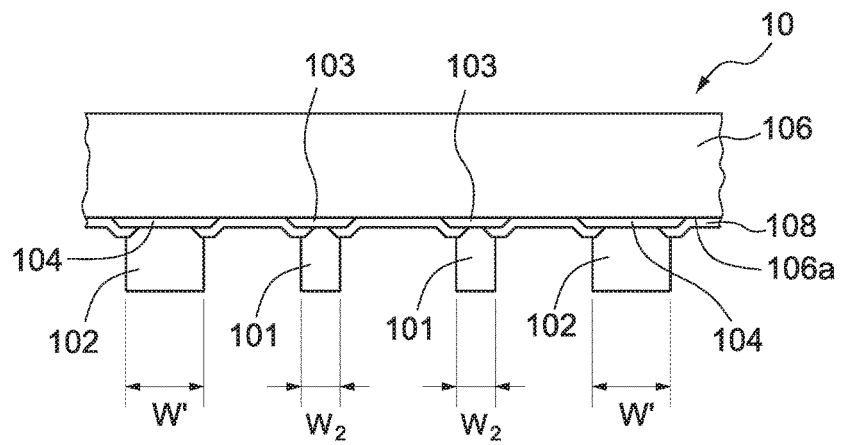
FIG. 3 illustrates a cross-sectional view of the region A1 shown in FIG. 2 according to an embodiment of the present disclosure.

FIG. 3 illustrates a cross-sectional view taken along line 3-3 of FIG. 2. The semiconductor chip 10 includes a chip main body 106, the first pillars 101, the second pillars 102, first pillar pads 103, second pillar pads 104 and a passivation layer 108. The chip main body 106 has a first surface 106a. The first pillars 101 and the second pillars 102 are disposed adjacent to the first surface 106a of the chip main body 106. In the embodiment illustrated in FIG. 3, the first pillar pads 103, the second pillar pads 104 and the passivation layer 108 are disposed on the first surface 106a of the chip main body 106. The passivation layer 108 covers the first surface 106a of the chip main body 106, and partially covers the first pillar pads 103 and the second pillar pads 104 to form a plurality of openings on respective ones of the first pillar pads 103 and the second pillar pads 104. The first pillars 101 and the second pillars 102 are disposed in the openings corresponding to the first pillar pads 103 and the second pillar pads 104, respectively.

Each of the first pillars 101 has the second width $W_2$, and each of the second pillars 102 has a diameter W'. In one or more embodiments, the second width $W_2$ of the first pillars 101 is less than the diameter W' of the second pillars 102. For example, the second width $W_2$ of the first pillars 101 is, but is not limited to, about half of the diameter W' of the second pillars 102. In one or more embodiments, a cross-sectional dimension of the first pillar pad 103 corresponding to the first pillar 101 is less than a cross-sectional dimension of the second pillar pad 104 corresponding to the second pillar 102. In other embodiments, cross-sectional dimensions of the first pillar pads 103 and the second pillar pads 104 may be similar.

Figure 4:
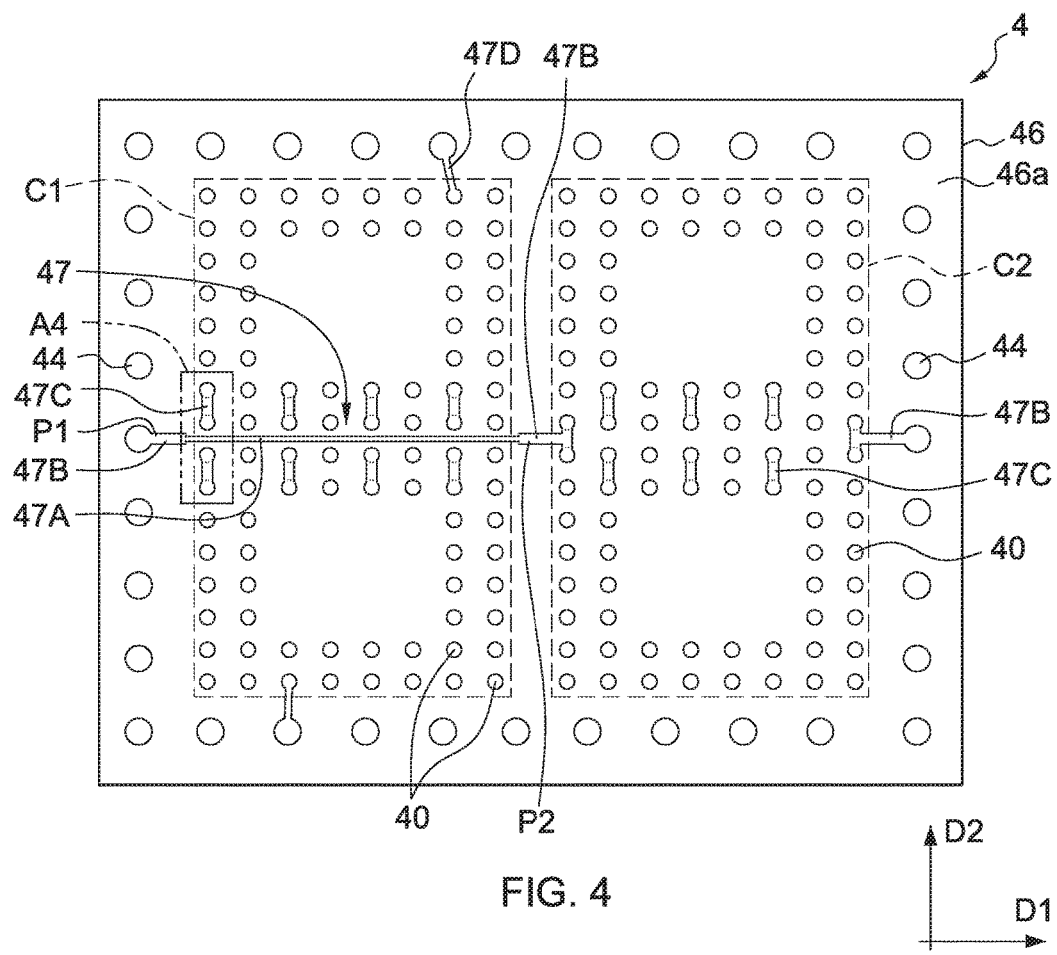
FIG. 4 illustrates a top view of a semiconductor device according to an embodiment of the present disclosure.

FIG. 4 illustrates a top view of a semiconductor device 4 according to an embodiment of the present disclosure. The semiconductor device 4 may be a substrate or an interposer, and includes a substrate main body 46, bump pads 40, bonding pads 44, one or more chip bonding areas C1, C2, and an RDL 47. The bump pads 40, the bonding pads 44, the chip bonding areas C1, C2, and the RDL 47 are disposed on or adjacent to a surface 46a of the substrate main body 46.

Each bump pad 40 has approximately a same shape from the top view, and each bump pad 40 is approximately circular with approximately a same diameter as the others of the bump pads 40. The bump pads 40 are provided for bumps to be disposed thereon, to connect to respective pillars of a semiconductor chip. As shown in FIG. 4, the bump pads 40 are arranged in an array, with a subarray of the bump pads 40 arranged in the chip bonding area C1, and a subarray of the bump pads 40 arranged in the chip bonding area C2. A virtual perimeter around an outermost ring of a group of the bump pads 40 on one side of the semiconductor device 4 outlines the chip bonding area C1, and another virtual perimeter around another outermost ring of another group of the bump pads 40 on the other side of the semiconductor device 4 outlines the chip bonding area C2. An area within the virtual perimeter of each of the chip bonding areas C1, C2 is substantially equal to a surface area of a corresponding semiconductor chip.

The bonding pads 44 are provided for interconnection elements (e.g., solder balls) to be disposed thereon; for example, to connect to a mother board. The bonding pads 44 are disposed at a periphery of the substrate main body 46 and surround the bump pads 40. Dimensions of the bonding pads 44 are greater than corresponding dimensions of the bump pads 40 (in the top view).

The RDL 47, the bump pads 40 and the bonding pads 44 may be formed during a same process stage (e.g., in a same plating and etching stage). The RDL 47, the bump pads 40 and the bonding pads 44 are in a same layer, are parts of a patterned circuit layer, and are made of a same material (e.g., copper). The RDL 47 connects the bump pads 40 to each other, the bonding pads 44 to each other, and/or the bump pads 40 to the bonding pads 44.

In the embodiment illustrated in FIG. 4, the RDL 47 includes a first portion 47A, a second portion 47B, a third portion 47C and a fourth portion 47D. The first portion 47A is disposed within the chip bonding area C1 and between two rows of the bump pads 40. That is, the first portion 47A is disposed at a gap between two rows of the bump pads 40. Thus, the first portion 47A of the RDL 47 extends through the chip bonding area C1, and is parallel with a first direction D1. The first portion 47A is physically connected to an electrical element outside the chip bonding area C1. In one or more embodiments, the electrical element is a bonding pad 44, the second portion 47B of the RDL 47, or a bump pad 40 in another chip bonding area (e.g., C2). It is noted that the electrical element and the RDL 47 are part of a same layer.

The second portion 47B of the RDL 47 is disposed outside the chip bonding area C1, and physically connects the first portion 47A and the bonding pad 44, or the first portion 47A and the third portion 47C. The third portion 47C is disposed within the chip bonding area C1 and physically connects two bump pads 40. The fourth portion 47D physically connects the bump pad 40 and the bonding pad 44. In one or more embodiments, widths of the second portion 47B, the third portion 47C and the fourth portion 47D are substantially the same; and a width of the first portion 47A is less than a width of the second portion 47B. The segment of the RDL 47 including the first portion 47A and the second portion 47B is substantially straight. The direct connection path of the first portion 47A and the second portion 47B passes through the gap between the two rows of the bump pads 40 without bypassing or routing away from the chip bonding area C1. In addition, because the width of the first portion 47A is less than the width of the second portion 47B, a risk of short circuit is low because the first portion 47A of the RDL 47 will not generally contact one or both of the two rows of the bump pads 40. Therefore, a length of a circuit path of the RDL 47 (and its impedance) can be significantly reduced. In other words, this embodiment is beneficial to yield a performance-improved circuitry.

Figure 5:
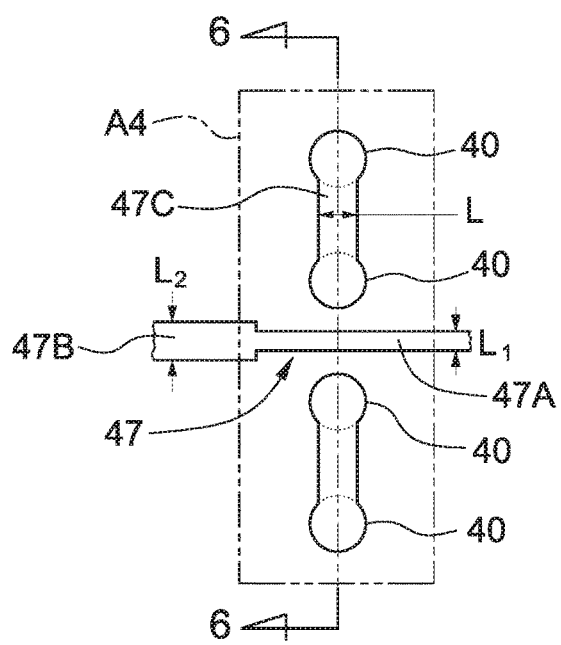
FIG. 5 illustrates an enlarged view of a region A4 shown in FIG. 4 according to an embodiment of the present disclosure.

FIG. 5 illustrates an enlarged view of a region A4 of the semiconductor device 4 shown in FIG. 4 according to an embodiment of the present disclosure. The third portion 47C connecting two bump pads 40 has a width L, the first portion 47A has a width $L_1$, and the second portion 47B has a width $L_2$. In one or more embodiments, the width L of the third portion 47C is substantially equal to the width $L_2$ of the second portion 47B, and the width $L_1$ of the first portion 47A is about half of the width $L_2$ of the second portion 47B. In other embodiments, the width $L_1$ of the first portion 47A is about ⅓ of the width $L_2$ of the second portion 47B. Further embodiments vary the widths L, $L_1$ and $L_2$ with respect to each other.

Figure 6:
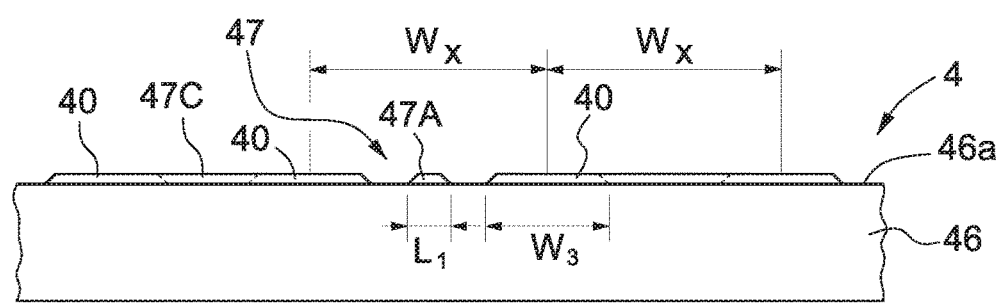
FIG. 6 illustrates a cross-sectional view of the region A4 shown in FIG. 5 according to an embodiment of the present disclosure.

FIG. 6 illustrates a cross-sectional view taken along line 6-6 of FIG. 5. As shown in FIG. 6, the semiconductor device 4 comprises the substrate main body 46, the bump pads 40 and the RDL 47. The bump pads 40 and the RDL 47 are disposed adjacent to the surface 46a of the substrate main body 46. The RDL 47 includes the first portion 47A disposed between two bump pads 40. As shown in FIG. 6, the width $L_1$ of the first portion 47A of the RDL 47 is about one third of a diameter $W_3$ of each of the bump pads 40. In one or more embodiments, the width $L_1$ of the first portion 47A may be, but is not limited to, about one half of to about one quarter of the diameter $W_3$ of each of the bump pads 40. In addition, a pitch $W_X$ between two adjacent bump pads 40 without the first portion 47A between is substantially the same as the pitch $W_X$ between two adjacent bump pads 40 with the first portion 47A between. Thus, the RDL 47 may be routed between the bump pads 40.

Figure 7:
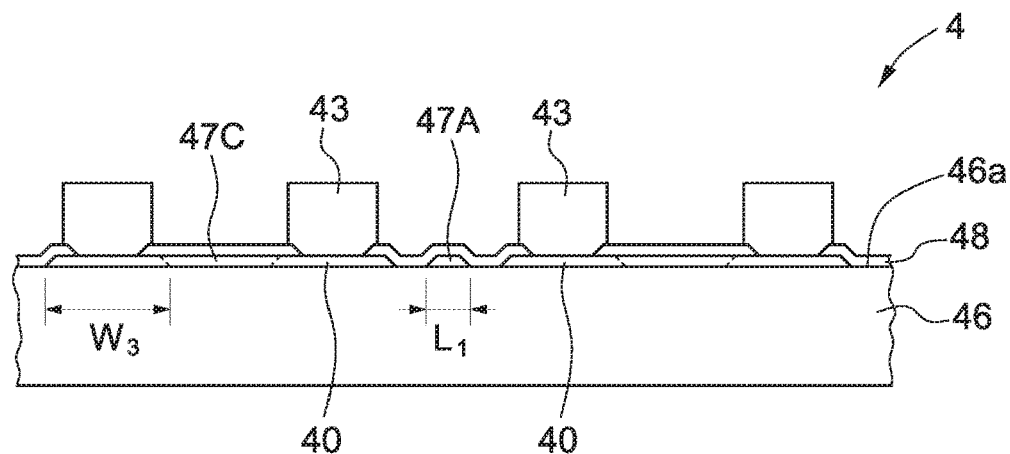
FIG. 7 illustrates a cross-sectional view of the region A4 shown in FIG. 5 according to an embodiment of the present disclosure.

FIG. 7 illustrates a cross-sectional view of the semiconductor device 4 of FIG. 6 according to an embodiment of the present disclosure, in which a protection layer 48 is disposed over the surface 46a of the substrate main body 46, and bumps 43 are disposed over respective bump pads 40. The protection layer 48 covers the surface 46a of the substrate main body 46 and the RDL 47, and partially covers the bump pads 40 to form a plurality of openings over respective ones of the bump pads 40. The bumps 43 are disposed in the openings corresponding to the bump pads 40. The bumps 43 are cylindrical. The sizes and positions of the bumps 43 correspond to the sizes and positions of the bump pads 40. Thus, because the pitch $W_X$ between two adjacent bump pads 40 is consistent (approximately the same) for each pair of adjacent bump pads 40, a pitch between each pair of adjacent bumps 43 can also be consistent (approximately the same) when bumps 43 are positioned on all of the bump pads 40. Note that, in FIG. 4, there are areas void of the bump pads 40; the term "adjacent" with respect to pairs of the bump pads 40 or pairs of the bumps 43 does not include pairs spanning such a void area.

Figure 8:
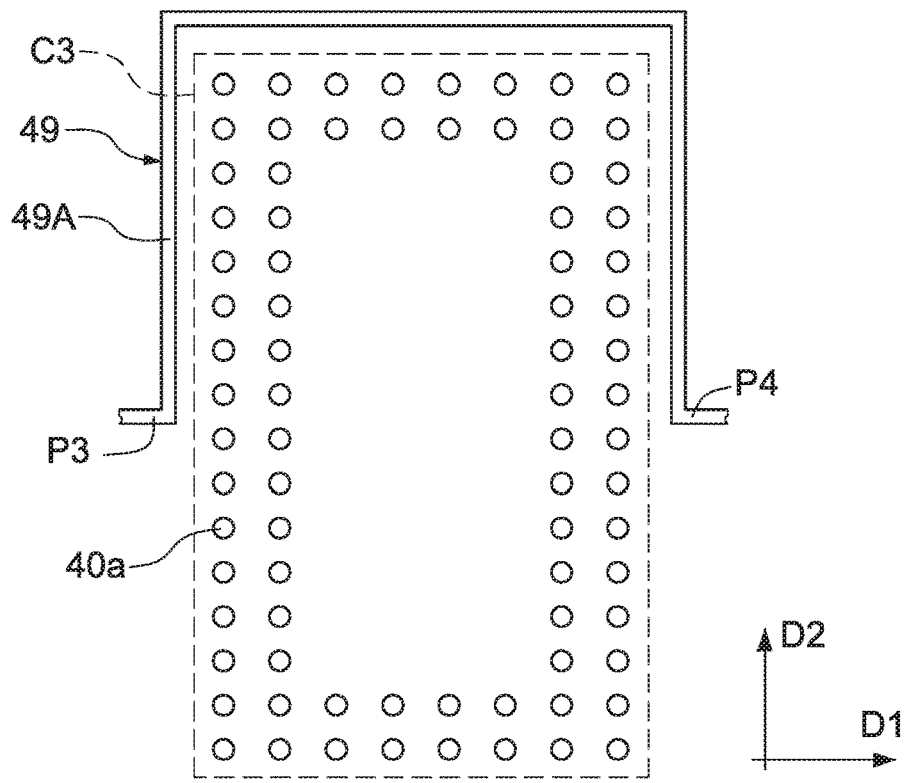
FIG. 8 illustrates a top view of a semiconductor package.

FIG. 8 illustrates a circuit design from top view by way of comparison. The circuit design of FIG. 8 includes a chip bonding area C3, bump pads 40a, and a portion 49A of an RDL 49. The circuit design of FIG. 8 does not allow routing of the RDL between bump pads 40a. Dimensions of the chip bonding area C3 are approximately the same as the dimensions of the chip bonding area C1 or C2 of FIG. 4. The bump pads 40a are disposed within the chip bonding area C3. The portion 49A of the RDL 49 has a consistent width, and the width of the portion 49A of the RDL 49 in FIG. 8 is same as the width of the second portion 47B of the RDL 47 in FIG. 4. The portion 49A of the RDL 49 in FIG. 8 is disposed outside the chip bonding area C3 and is routed around the chip bonding area C3.

For purposes of comparison, in an example of the circuit design of FIG. 8, a width of the chip bonding area C3 is about 7 millimeters (mm), the width of the portion 49A is about 20 micrometers (μm), a thickness of the portion 49A is about 3 μm, a length of the portion 49A from a point P3 to a point P4 is about 20.7 mm, and a resistance of the portion 49A from the point P3 to the point P4 is about 5.8 Ohm.

In comparison, for an example of the embodiment of FIG. 4, a width of the chip bonding area C1 is about 7 mm (akin to the width of the chip bonding area C3 of FIG. 8), the width $L_2$ of the second portion 47B is about 20 µm (akin to the width of the portion 49A of FIG. 8), and a thickness of the segment including the first portion 47A and the second portion 47B is about 3 µm (akin to the thickness of the portion 49A of FIG. 8). However, the width $L_1$ of the first portion 47A is about 10 µm, a length of the segment from a point P1 to a point P2 is about 11.2 mm, and a resistance of the segment from point P1 to point P2 is about 5.26 Ohm. As compared with FIG. 8, it would be understood that the configuration according to the embodiment of FIG. 4 can lower a resistance between two points by reducing a path length in the RDL.

Figure 9:
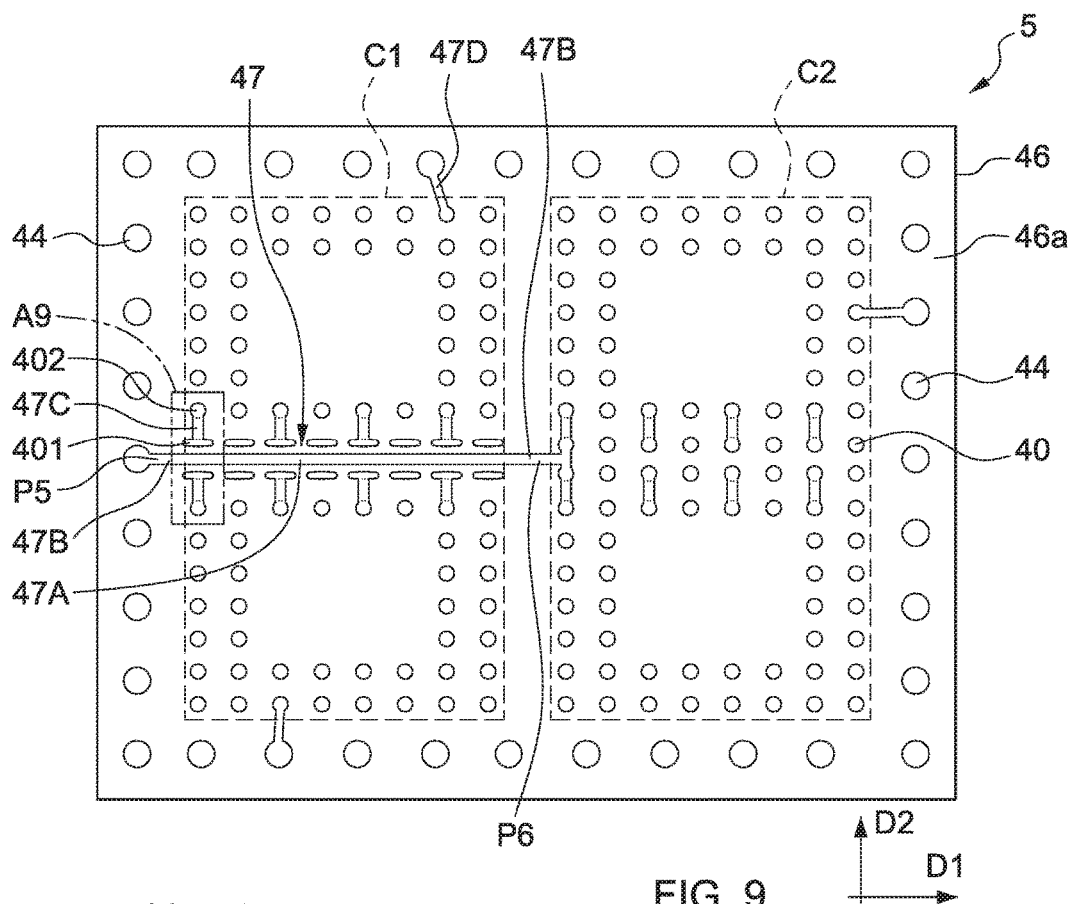
FIG. 9 illustrates a top view of a semiconductor device according to an embodiment of the present disclosure.

FIG. 9 illustrates a top view of a semiconductor device 5 according to an embodiment of the present disclosure. The semiconductor device 5 of FIG. 9 is similar to the semiconductor device 4 illustrated in FIG. 4, a difference being that, in FIG. 9, bumps pads 40 include first bump pads 401 and second bump pads 402, and a width of a first portion 47A of an RDL 47 is substantially equal to a width of a second portion 47B of an RDL 47.

Figure 10:
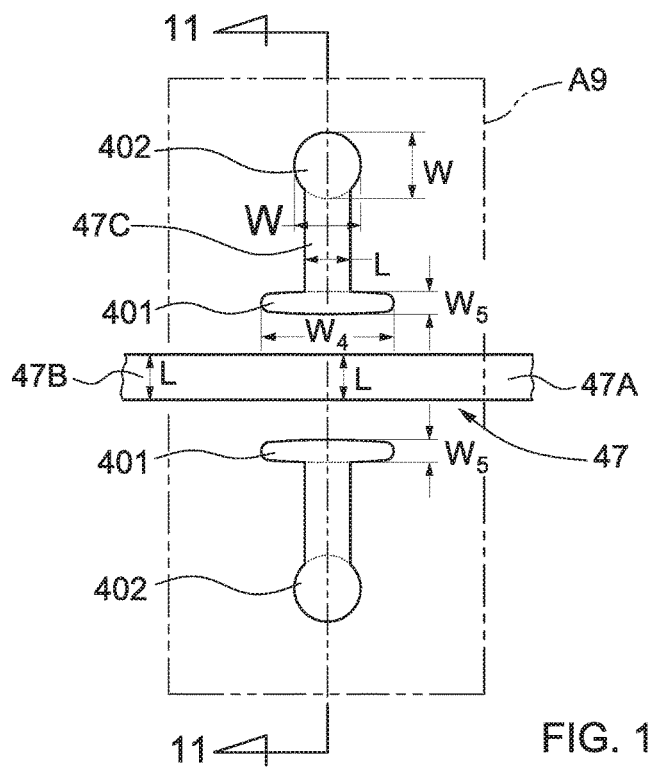
FIG. 10 illustrates an enlarged view of a region A9 shown in FIG. 9 according to an embodiment of the present disclosure.

The first bump pad 401 has a first profile from the top view, and the second bump pad 402 has a second profile from the top view, and a shape of the first profile is different from a shape of the second profile (an example is provided with respect to FIG. 10). The first and second bump pads 401 and 402 are provided for bumps to be disposed thereon, to connect to pillars of a semiconductor chip. As shown in FIG. 9, the bump pads 40 are arranged in an array, with a subarray of the bump pads 40 arranged in the chip bonding area C1, and a subarray of the bump pads 40 arranged in the chip bonding area C2. A virtual perimeter around an outermost ring of a group of the bump pads 40 on one side of the semiconductor device 4 outlines the chip bonding area C1, and another virtual perimeter around another outermost ring of another group of the bump pads 40 on the other side of the semiconductor device 4 outlines the chip bonding area C2. An area within the virtual perimeter of each of the chip bonding areas C1, C2 is substantially equal to a surface area of a corresponding semiconductor chip.

Bonding pads 44 are provided for interconnection elements (e.g., solder balls) to be disposed thereon; for example, to connect to a mother board. The bonding pads 44 are disposed at a periphery of a substrate main body 46 and surround the bump pads 40. Dimensions of the bonding pads 44 are greater than corresponding dimensions of the bump pads 40 (in the top view).

The RDL 47, the bump pads 40 and the bonding pads 44 may be formed during a same process stage (e.g., in a same plating and etching stage). The RDL 47, the bump pads 40 and the bonding pads 44 are in a same layer, are parts of a patterned circuit layer, and are made of a same material (e.g., copper). The RDL 47 connects the bump pads 40 to each other, the bonding pads 44 to each other, and/or the bump pads 40 to the bonding pads 44.

In the embodiment illustrated in FIG. 9, the RDL 47 includes a first portion 47A, a second portion 47B, a third portion 47C and a fourth portion 47D. The first portion 47A is disposed within the chip bonding area C1 and between two rows of the first bump pads 401. That is, the first portion 47A is disposed at a gap between two rows of the first bump pads 401. Thus, the first portion 47A of the RDL 47 extends through the chip bonding area C1, and is parallel with a first direction D1. The first portion 47A is physically connected to an electrical element outside the chip bonding area C1. In one or more embodiments, the electrical element is a bonding pad 44, the second portion 47B of the RDL 47, a first bump pad 401 or a second bump pad 402 in another chip bonding area (e.g., C2). It is noted that the electrical element and the RDL 47 are part of a same layer.

The second portion 47B of the RDL 47 is disposed outside the chip bonding area C1, and physically connects the first portion 47A and the bonding pad 44, or the first portion 47A and the third portion 47C. The third portion 47C is disposed within the chip bonding area C1, and physically connects the first bump pad 401 and the second bump pad 402. The fourth portion 47D physically connects the second bump pad 402 and the bonding pad 44. In one or more embodiments, widths of the first portion 47A, the second portion 47B, the third portion 47C and the fourth portion 47D are substantially the same. A segment of the RDL 47 including the first portion 47A and the second portion 47B is substantially straight. The direct connection path of the first portion 47A and the second portion 47B passes through the gap between the two rows of the first bump pads 401 without bypassing or routing away from the chip bonding area C1. In addition, because a width of the first bump pads 401 in a direction D2 is less than the width of the bump pads 402 in the direction D2, a risk of short circuit is low because the first portion 47A of the RDL 47 will not generally contact one or both of the two rows of the first bump pads 401. Therefore, a length of a circuit path of the RDL 47 (and its impedance) can be significantly reduced. In other words, this embodiment is beneficial to yield a performance-improved circuitry.

FIG. 10 illustrates an enlarged view of a region A9 of the semiconductor device 5 shown in FIG. 9 according to an embodiment of the present disclosure. In this embodiment, a shape of a first profile of the first bump pads 401 is substantially elliptical, and a shape of a second profile of the second bump pads 402 is substantially circular. The first profile of the first bump pad 401 has a first width $W_4$ along the first direction D1 and a second width $W_5$ along a second direction D2 perpendicular to the first direction D1. The first width $W_4$ of the first profile of the first bump pad 401 is greater than the second width $W_5$ of the first profile of the first bump pad 401. In one or more embodiments, the first width $W_4$ of the first profile of the first bump pad 401 is at least about 2 time greater, at least about 3 times greater, or about four to about nine times greater than the second width $W_5$ of the first profile of the first bump pad 401. In other words, $(W_4)>(n)(W_5)$, where, in some embodiments, $4 \leq n \leq 9$.

In the embodiment illustrated in FIG. 10, the shape of the second profile of the second bump pad 402 is approximately circular with a diameter W. More generally, the second profile has a first width along the first direction D1 and a second width along the second direction D2 perpendicular to the first direction, and the first width of the second profile is substantially equal to the second width of the second profile. As shown in FIG. 10, the first width $W_4$ of the first profile of the first bump pad 401 is about two times the diameter W of the second profile of the second bump pad 402, and the second width $W_5$ of the first profile of the bump pad 401 is about one half of the diameter W of the second profile of second bump pad 402. In this embodiment, the first width $W_4$ of the first profile of the first bump pad 401 is about four times the second width $W_5$ of the first profile of the first bump pad 401. Other relative dimensions are contemplated for other embodiments. In one or more embodiments, an area of the first profile of the first bump pad 401 is substantially equal to an area of the second profile of the second bump pad 402. In one or more embodiments, a pitch between adjacent first bump pads 401 is consistent (each pair of adjacent first bump pads 401 has approximately a same pitch), and a pitch between adjacent second bump pads 402 is consistent (each pair of adjacent second bump pads 402 has approximately a same pitch). In one or more embodiments, a pitch between an adjacent first bump pad 401 and second bump pad 402 is consistent (each pair of a first bump pad 401 adjacent to a second bump pad 402 has approximately a same pitch). It is noted that the pitch between adjacent first bump pads 401, the pitch between adjacent second bump pads 402, and the pitch between an adjacent first bump pad 401 and second bump pad 402 may be approximately the same, or may be different.

Figure 11:
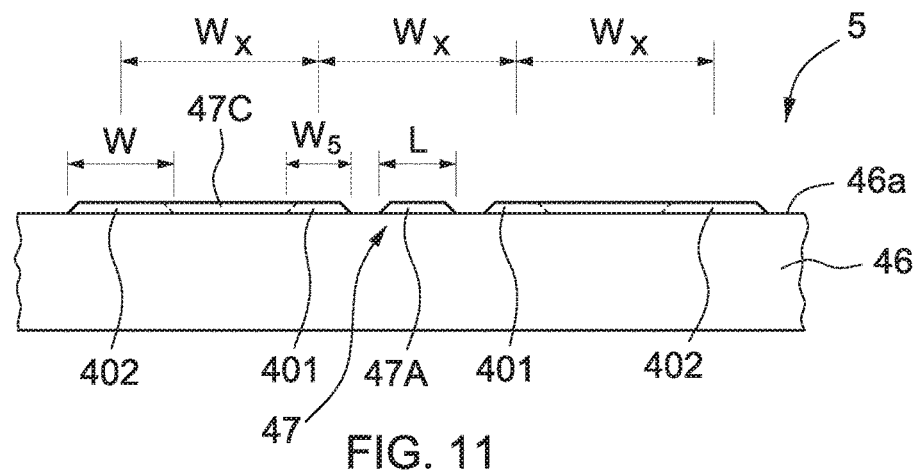
FIG. 11 illustrates a cross-sectional view of the region A9 shown in FIG. 10 according to an embodiment of the present disclosure.

FIG. 11 illustrates a cross-sectional view taken along line 11-11 of FIG. 10. As shown in FIG. 11, the semiconductor device 5 includes the substrate main body 46, the first bump pads 401, the second bump pads 402, and the RDL 47. The first bump pads 401, the second bump pads 402 and the RDL 47 are disposed adjacent to a surface 46a of the substrate main body 46. The RDL includes the first portion 47A disposed between two first bump pads 401. In addition, a pitch $W_X$ between two adjacent bump pads 40 (bump pads 401 or 402) without the first portion 47A between is substantially the same as the pitch $W_X$ between two adjacent bump pads 40 (bump pads 401) with the first portion 47A between. Thus, the RDL may be routed between the bump pads 40.

Figure 12:
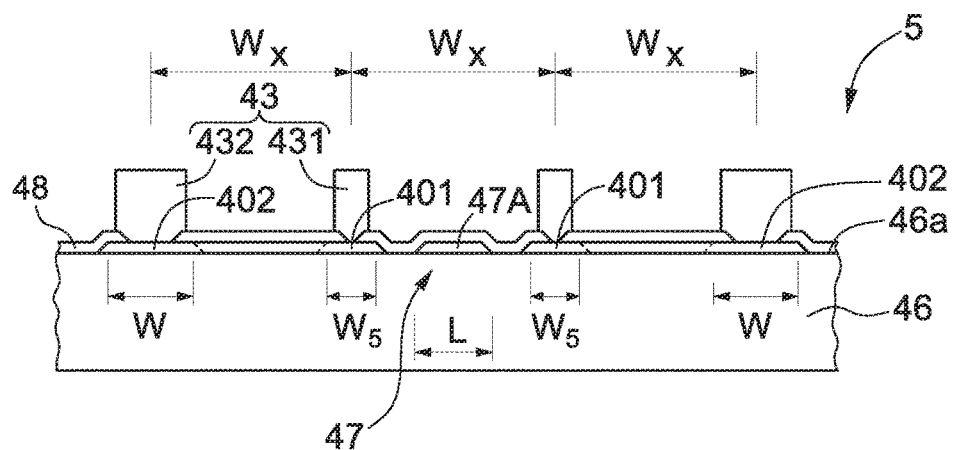
FIG. 12 illustrates a cross-sectional view of the region A9 shown in FIG. 10 according to an embodiment of the present disclosure.

FIG. 12 illustrates a cross-sectional view of the semiconductor device 5 of FIG. 11 according to an embodiment of the present disclosure, in which a protection layer 48 is disposed over the surface 46a of the substrate main body 46, and bumps 43 are disposed over respective bump pads 40. The bumps 43 include first bumps 431 disposed over respective bump pads 401 and second bumps 432 disposed over respective bump pads 402. The protection layer 48 covers the surface 46a of the substrate main body 46 and the RDL 47, and partially covers the bump pads 40 (the first bump pads 401 and the second bump pads 402) to form a plurality of openings over respective ones of the bump pads 40. The bumps 43 are disposed in the openings corresponding to the bump pads 40. The first bumps 431 and the second bumps 432 are disposed in the openings corresponding to the first bumps pads 401 and the second bump pads 402, respectively. The bumps 43 are cylindrical. The sizes and positions of the bumps 43 correspond to the sizes and positions of the bump pads 40. Thus, if the pitch $W_X$ between two adjacent bump pads 40 is consistent (approximately the same) for each pair of adjacent bump pads 40, a pitch between each pair of adjacent bumps 43 can also be consistent (approximately the same) when bumps 43 are positioned on all of the bump pads 40. Note that, in FIG. 9, there are areas void of the bump pads 40; the term "adjacent" with respect to pairs of the bump pads 40 or pairs of the bumps 43 does not include pairs spanning such a void area.

As shown in FIGS. 9-12, the first portion 47A of the RDL 47 extends through the gap between two rows of the first bump pads 401 (as shown in FIG. 9). Such a direct connection path through the gap space between two first bump pads 401 avoids bypassing or routing away from the chip bonding area C1 (as shown in FIG. 9). In addition, because the width of the first bump pads 401 in the direction D2 is less than the width of the second bump pads 402 in the direction D2, a risk of short circuit is low because the first portion 47A of the RDL 47 will not generally contact one or both of the two rows of the bump pads 401. Therefore, a length of a circuit path of the RDL 47 (and its impedance) can be significantly reduced. In other words, this embodiment is beneficial to yield a performance-improved circuitry.

Figure 13:
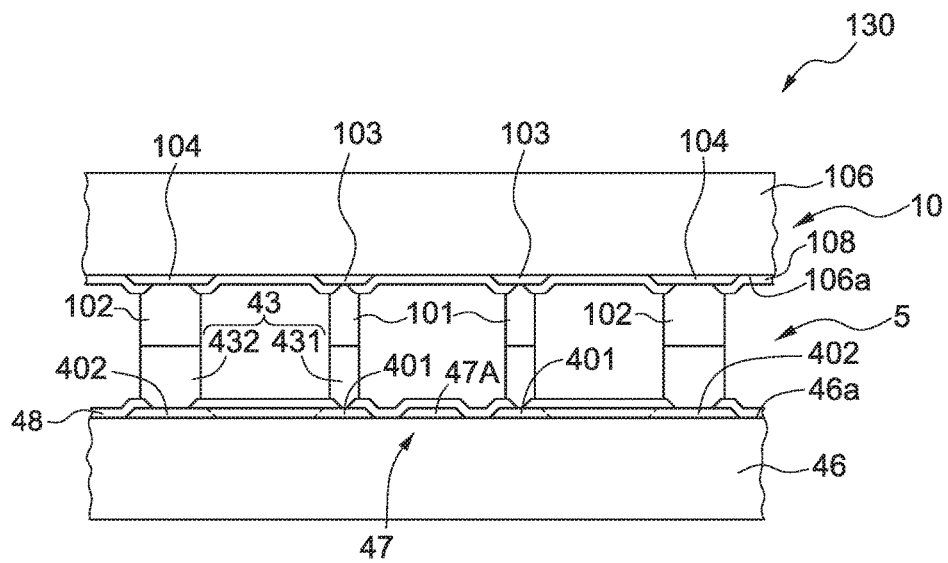
FIG. 13 illustrates a cross-sectional view of a semiconductor device according to an embodiment of the present disclosure.

FIG. 13 illustrates a cross-sectional view of a semiconductor device 130 according to an embodiment of the present disclosure. The semiconductor device 130 may be a package, and includes a semiconductor chip 10 (as shown in FIG. 3) and a semiconductor device 5 (as shown in FIG. 12). In FIG. 13, the first pillars 101 of the semiconductor chip 10 are physically connected to the first bumps 431 of the semiconductor device 5, and the second pillars 102 of the semiconductor chip 10 are physically connected to the second bumps 432 of the semiconductor device 5. In the embodiment illustrated in FIG. 13, the second width $W_2$ of the first pillar 101 (refer to FIG. 2) and a corresponding width of the first bump 431 are substantially the same, and the diameter W' of the second pillar 102 (refer to FIG. 2) and a corresponding width of the second bump 432 are substantially the same. As can be seen in FIG. 13, the first portion 47A of the RDL 47 is routed under the semiconductor chip 10.

Figure 14:
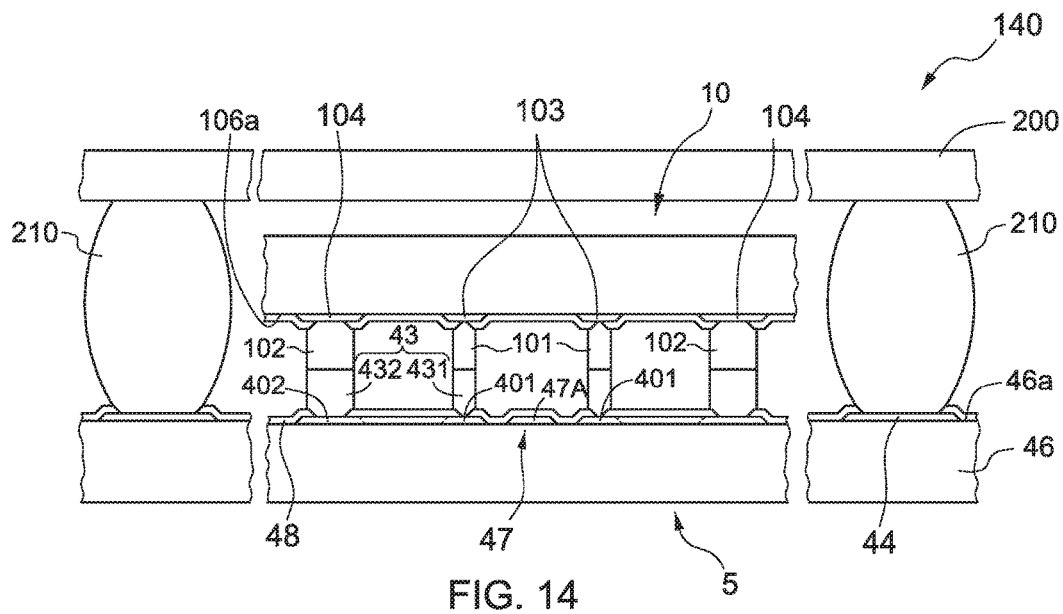
FIG. 14 illustrates a cross-sectional view of a semiconductor device according to an embodiment of the present disclosure.

FIG. 14 illustrates a cross-sectional view of a semiconductor device 140 according to an embodiment of the present disclosure. The semiconductor device 140 of FIG. 14 is similar to the semiconductor device 130 illustrated in FIG. 13, and the semiconductor device 140 further comprises a mother board 200 and at least one interconnection element 210. The interconnection element(s) 210 connect the mother board 200 and respective bonding pad(s) 44 of the semiconductor device 5 (FIG. 9). The mother board 200 may be, for example, a printed circuit board (PCB), and the interconnection element 210 may be a solder ball.

Figure 15:
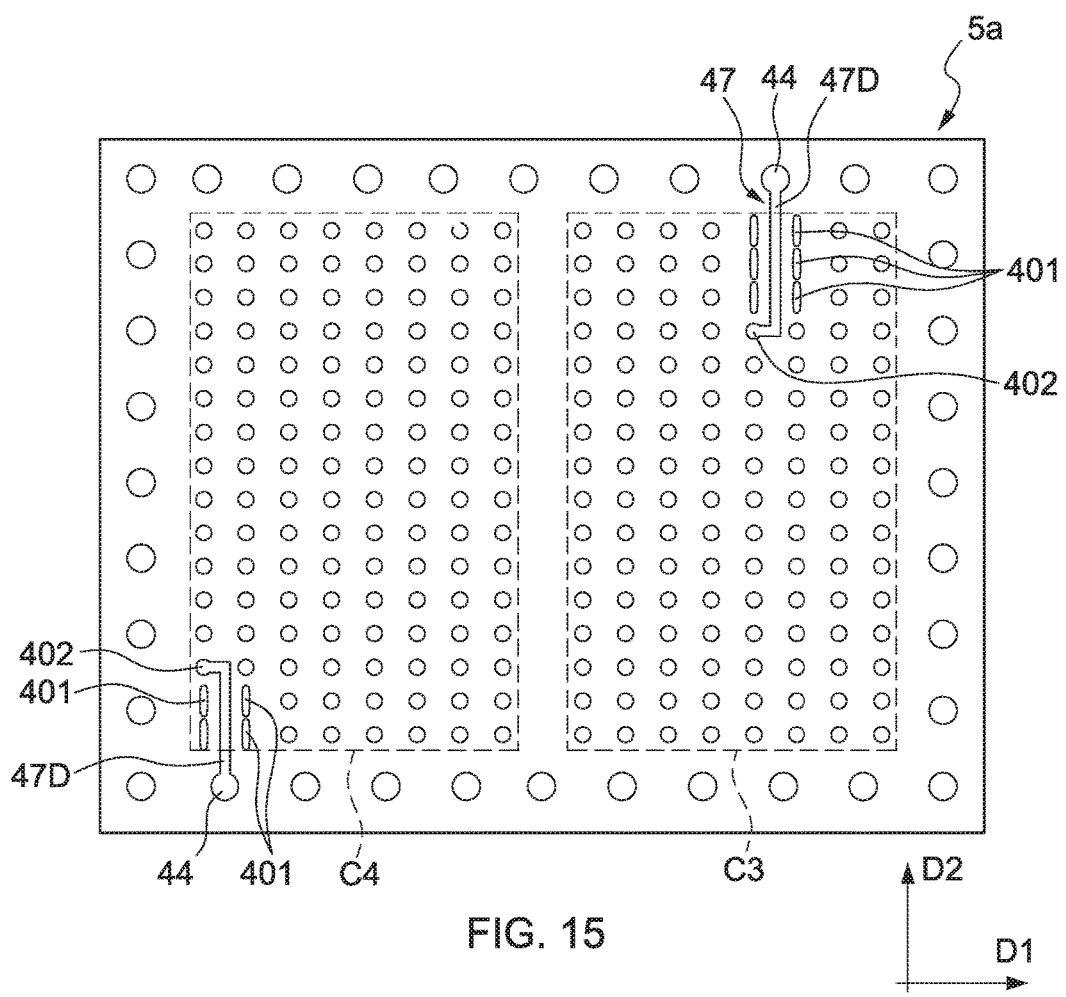
FIG. 15 illustrates a top view of a semiconductor device according to an embodiment of the present disclosure.

FIG. 15 illustrates a top view of a semiconductor device 5a according to an embodiment of the present disclosure. Similarly numbered features in FIG. 15 and FIG. 9 refer to similar components. The semiconductor device 5a is a substrate, and includes the first bump pads 401, the second bump pads 402, the fourth portion 47D of the RDL 47, and the bonding pads 44. The first bump pads 401 and the second bump pads 402 are arranged in two subarrays to define two chip bonding areas C3 and C4. In the embodiment illustrated in FIG. 15, the first bump pads 401 are arranged along the second direction D2, the width of the first bump pads 401 along direction D2 is greater than the width of the first bump pads 401 along direction D1, and the fourth portion 47D of the RDL 47 is parallel with the second direction D2.

One end of the fourth portion 47D of the RDL 47 is connected to a second bump pad 402 within the chip bonding areas C3, C4, and the other end of the fourth portion 47D of the RDL 47 is connected to an electrical element outside the chip bonding areas C3, C4. In one or more embodiments, the electrical element is a bonding pad 44, another portion of the RDL 47, or a bump pad 40 in another chip bonding area (e.g., in the other of the chip bonding areas C3, C4). The arrangement of the first bump pads 401 provides for a wider gap between the first bump pads 401, so that the fourth portion 47D of the RDL 47 can pass through the gap between the two adjacent first bump pads 401 directly. Accordingly, the fourth portion 47D of the RDL 47 can be routed under a semiconductor chip.

Figure 16A:
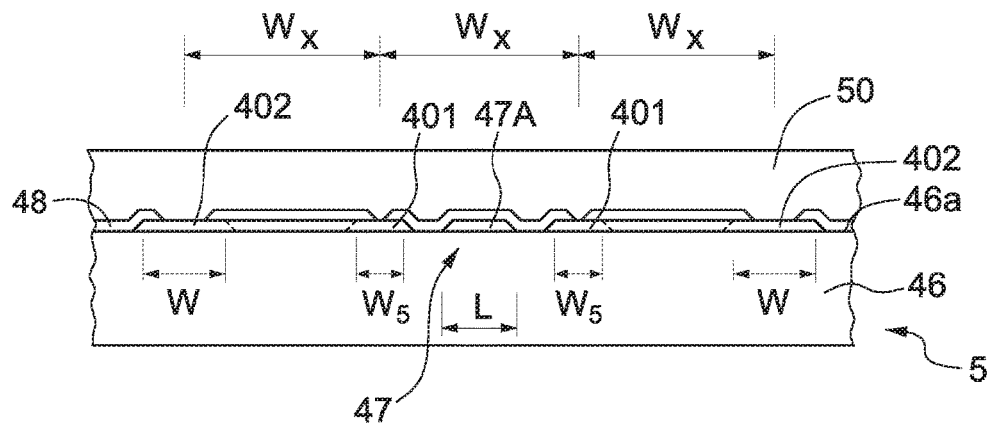
FIG. 16A, FIG. 16B, FIG. 16C and FIG. 16D illustrate a manufacturing process according to an embodiment of the present disclosure.

FIGS. 16A-16D illustrate a manufacturing process according to an embodiment of the present disclosure. In this embodiment, the manufacturing process is used to manufacture the semiconductor device 5 as shown in FIG. 12. However, the manufacturing process may also be used to manufacture the semiconductor chip 10 as shown in FIG. 1 to FIG. 3. Referring to FIG. 16A, the semiconductor device 5 as shown in FIG. 11 is provided. The semiconductor device 5 includes a protection layer 48 disposed over the surface 46a of the substrate main body 46. The protection layer 48 covers the surface 46a of the substrate main body 46 and the RDL 47, and partially covers the first bump pads 401 and the second bump pads 402 to form openings exposing respective ones of the first bumps pads 401 and second bump pads 402. A photoresist layer 50 is formed over the protection layer and the exposed first bump pads 401 and second bump pads 402. In some embodiments, the protection layer 48 is omitted, and the photoresist layer 50 is formed over the surface 46a and over the first bumps pads 401 and the second bump pads 402.

Figure 16B:
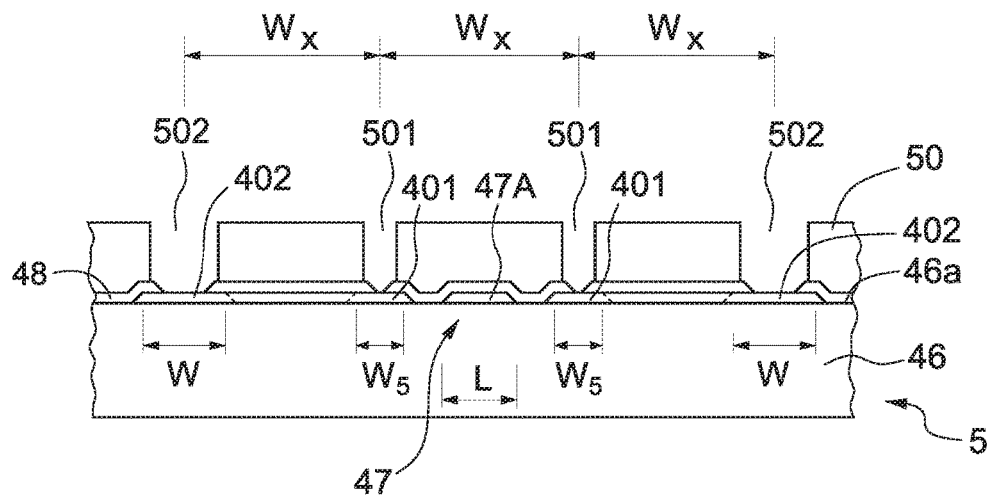

Referring to FIG. 16B, first openings 501 and second openings 502 are formed in the photoresist layer 50. The first openings 501 and the second openings 502 extend through the photoresist layer 50 to expose the first bumps pads 401 the second bumps pads 402, respectively. That is, the position of the first openings 501 and the second openings 502 correspond to respective first bumps pads 401 and second bumps pads 402.

Figure 16C:
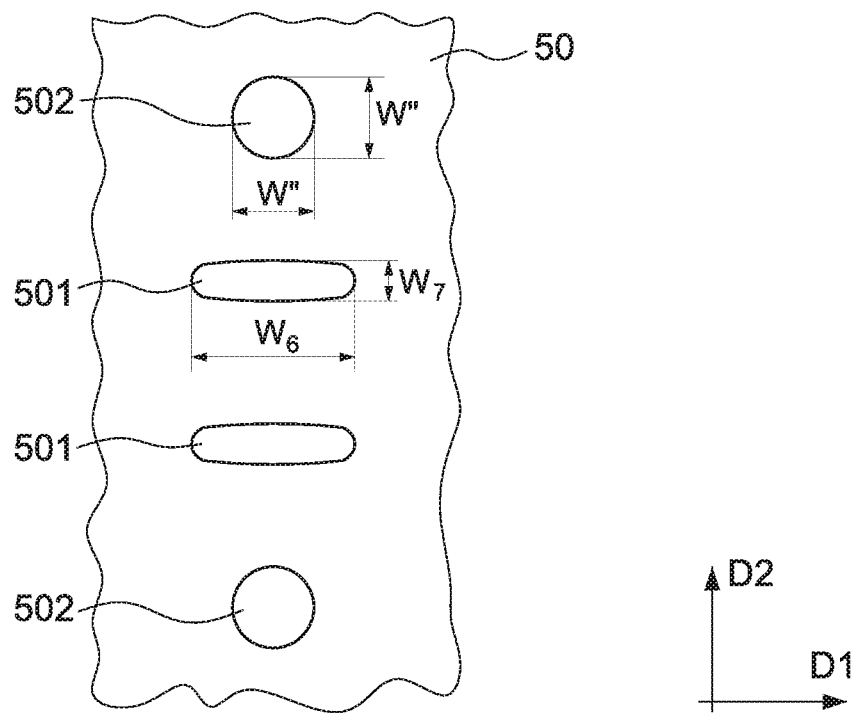

Referring to FIG. 16C, a top view of a partial area of the photoresist layer 50 of FIG. 16B is shown. In FIG. 16C, each of the first openings 501 defines a first profile, and each of the second openings 502 defines a second profile. The first profile of the first openings 501 has a first width $W_6$ along a first direction D1 and a second width $W_7$ along a second direction D2 perpendicular to the first direction D1. The first width $W_6$ of the first profile of the first opening 501 is greater than the second width $W_7$ of the first profile of the first opening 501. In one or more embodiments, the first width $W_6$ of the first profile of the first opening 501 is greater than the second width $W_7$ of the first profile of the first opening 501 by at least about 2 times, at least about 3 times, or about four to about nine times. In other words, $(W_6)>(n)(W_7)$, where, in some embodiments, $4<n<9$. In the embodiment illustrated in FIG. 16C, the shape of the second profile of the second opening 502 is circular and has a diameter W". Referring to FIG. 16C and FIG. 10, the first width $W_6$ of the first profile of the first opening 501 may be substantially equal to the first width $W_4$ of the first profile of the first bump pad 401, the second width $W_7$ of the first profile of the first opening 501 may be substantially equal to the second width $W_5$ of the first profile of the first bump pad 401, and the diameter W" of the second profile of the second opening 502 may be substantially equal to the diameter W of the second profile of the second bump pad 402.

In one or more embodiments, the first width $W_6$ of the first profile of the first opening 501 is about two times the diameter W" of the second profile of the second opening 502, and the second width $W_7$ of the first profile of the first opening 501 is about half of the diameter W" of the second profile of second opening 502. Thus, in this embodiment, the first width $W_6$ of the first profile of the first opening 501 is about four times the second width $W_7$ of the first profile of the first opening 501. Different relative dimensions are contemplated for other embodiments. As shown in FIG. 16B, heights of the first opening 501 and the second opening 502 are substantially the same. In one or more embodiments, an area of the first profile of the first opening 501 is substantially equal to an area of the second profile of the second opening 502; thus, volumes of the first opening 501 and the second opening 502 are substantially the same.

Figure 16D:
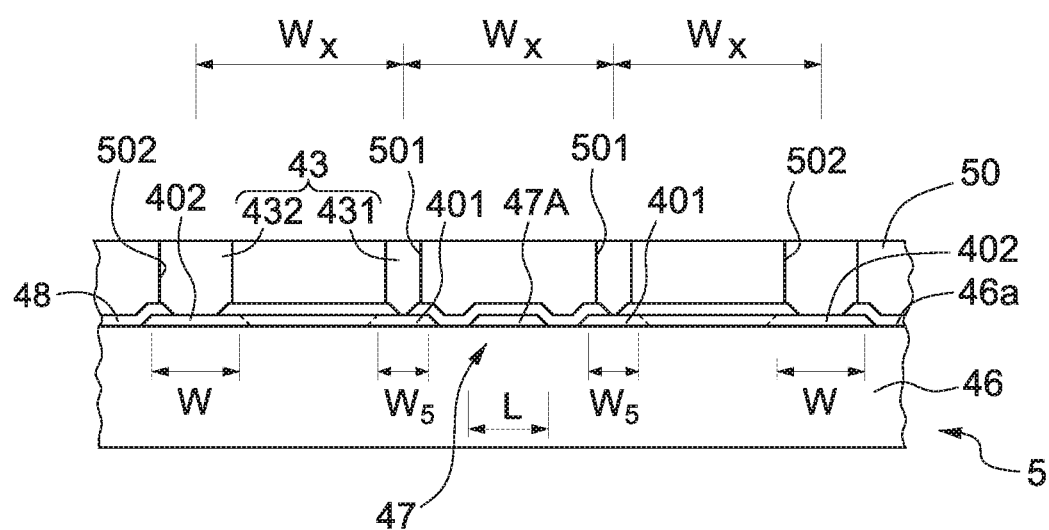

Referring to FIG. 16D, the first openings 501 and the second openings 502 are filled in a same process stage by a metal material (e.g., copper) to form the first bumps 431 (see FIG. 12) in the first openings 501 and the second bumps 432 (see FIG. 12) in the second openings 502, or to form the first pillars 101 (see FIG. 3) in the first openings 501 and the second pillars 102 (see FIG. 3) in the second openings 502.

In an embodiment in which the volumes of the first opening 501 and the second opening 502 are substantially the same, the first opening 501 and the second opening 502 may be filled concurrently (e.g., using one electroplating stage), which simplifies the manufacturing process. In comparison, multiple electroplating stages may be needed if the bumps had different cross-sectional areas (e.g., openings in the photoresist layer with small diameter are filled using a first electroplating, and then a second electroplating fills openings of the photoresist layer with greater diameter).

After filling the first openings 501 and the second openings 502, the photoresist layer 50 is removed to obtain the semiconductor device 5 shown in FIG. 12.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For another example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor chip, comprising:
    a chip main body;
    at least one first pillar disposed adjacent to a surface of the chip main body, wherein the at least one first pillar has a first profile from a bottom view, the first profile of each first pillar of the at least one first pillar has a first width along a first direction and a second width along a second direction perpendicular to the first direction, and the first width of the first profile of each first pillar of the at least one first pillar is greater than the second width of the first profile of each first pillar of the at least one first pillar; and
    at least one second pillar disposed on and directly contacting the surface of the chip main body, wherein the at least one second pillar has a second profile from a bottom view, and a shape of the first profile of each first pillar of the at least one first pillar is different from a shape of the second profile of each second pillar of the at least one second pillar;
    wherein an area of the first profile of each first pillar of the at least one first pillar is substantially equal to an area of the second profile of each second pillar of the at least one second pillar.

2. The semiconductor chip of claim 1, wherein the at least one first pillar is a plurality of first pillars arranged along the first direction.

3. The semiconductor chip of claim 1, wherein the at least one second pillar is a plurality of second pillars arranged in an array.

4. The semiconductor chip of claim 1, wherein the second profile of each second pillar of the at least one second pillar has a first width along the first direction and a second width along the second direction perpendicular to the first direction, and the first width of the second profile of each second pillar of the at least one second pillar is substantially equal to the second width of the second profile of each second pillar of the at least one second pillar.

5. The semiconductor chip of claim 4, wherein the first width of first profile of each first pillar of the at least one first pillar is about two times the first width of the second profile of each second pillar of the at least one second pillar, and the second width of the first profile of each first pillar of the at least one first pillar is about half of the second width of the second profile of each second pillar of the at least one second pillar.

6. A semiconductor device, comprising:
    a substrate main body;
    a plurality of first bump pads disposed on and directly contacting a surface of the substrate main body, each first bump pad of the plurality of first bump pads has a first profile from a top view, the first profile of each first bump pad of the plurality of first bump pads has a first width along a first direction and a second width along a second direction perpendicular to the first direction, and the first width of the first profile of each first bump pad of the plurality of first bump pads is greater than the second width of the first profile of each first bump pad of the plurality of first bump pads;
    a redistribution layer disposed on and directly contacting the surface of the substrate main body, wherein the redistribution layer includes a first portion disposed between two first bump pads of the plurality of first bump pads; and
    a plurality of second bump pads, each second bump pad of the plurality of second bump pads has a second profile from a top view, and a shape of the second profile of each second bump pad of the plurality of second bump pads is different from a shape of the first profile of each first bump pad of the plurality of first bump pads, and an area of the first profile of each first bump pad of the plurality of first bump pads is substantially equal to an area of the second profile of each second bump pad of the plurality of second bump pads.

7. The semiconductor device of claim 6, further comprising a chip bonding area on the substrate main body and an electrical element outside the chip bonding area, the first portion of the redistribution layer is disposed within the chip bonding area, and the first portion of the redistribution layer is physically connected to the electrical element outside the chip bonding area.

8. The semiconductor device of claim 7, wherein a virtual perimeter around an outermost ring of a group of first bump pads of the plurality of first bump pads outlines the chip bonding area.

9. The semiconductor device of claim 7, wherein the first portion of the redistribution layer extends through the chip bonding area.

10. The semiconductor device of claim 7, wherein the chip bonding area is a first chip bonding area, the semiconductor device further comprising a second chip bonding area on the substrate main body, and wherein the electrical element is a bonding pad, a second portion of the redistribution layer, or a bump pad in the second chip bonding area, and the electrical element and the redistribution layer are in a same layer.

11. The semiconductor device of claim 6, further comprising a plurality of bumps disposed on the plurality of first bump pads.

12. The semiconductor device of claim 6, wherein the plurality of first bump pads are arranged along the first direction, and the first portion of the redistribution layer is parallel with the first direction.

13. The semiconductor device of claim 6, wherein the first width of the first profile of each first bump pad of the plurality of first bump pads is about two times a first width of the second profile of each second bump pad of the plurality of second bump pads, and the second width of the first profile of each first bump pad of the plurality of first bump pads is about half of a second width of the second profile of each second bump pad of the plurality of second bump pads.

14. The semiconductor device of claim 6, further comprising a semiconductor chip bonded to the plurality of first bump pads, the plurality of second bump pads, or the plurality of first bump pads and the plurality of second bump pads.

15. The semiconductor device of claim 6, further comprising a mother board and at least one interconnection element, wherein the at least one interconnection element connects the mother board and the substrate main body.

16. A semiconductor device, comprising:
a substrate main body having a surface, the substrate main body including a plurality of pads adjacent to the surface of the substrate main body; and
a plurality of first metal bumps, each first metal bump of the plurality of first metal bumps having a first profile from a top view; and a plurality of second metal bumps, each second metal bump of the plurality of second metal bumps having a second profile from a top view disposed on the plurality of pads; wherein the first profile of each first metal bump of the plurality of first metal bumps is different from the second profile of each second metal bump of the plurality of second metal bumps, and an area of the second profile of each second metal bump of the plurality of second metal bumps is substantially equal to an area of the first profile of each first metal bump of the plurality of first metal bumps.

17. The semiconductor device of claim 16, wherein the first profile of each first metal bump of the plurality of first metal bumps has a first width along a first direction and a second width along a second direction perpendicular to the first direction, the first width of the first profile of each first metal bump of the plurality of first metal bumps is greater than the second width of the first profile of each first metal bump of the plurality of first metal bumps; and
wherein the second profile of each second metal bump of the plurality of second metal bumps has a first width along the first direction and a second width along the second direction perpendicular to the first direction, and the first width of the second profile of each second metal bump of the plurality of second metal bumps is substantially equal to the second width of the second profile of each second metal bump of the plurality of second metal bumps.

18. The semiconductor device of claim 16, further comprising:
a redistribution layer disposed adjacent to the surface of the substrate main body, wherein the redistribution layer includes a first portion passing through a gap space between two pads of the plurality of pads.

* * * * *